United States Patent
Adam et al.

(10) Patent No.: US 9,034,741 B2
(45) Date of Patent: May 19, 2015

(54) HALO REGION FORMATION BY EPITAXIAL GROWTH

(71) Applicant: International Business Machines Corporation, Armonk, NY (US)

(72) Inventors: Thomas N. Adam, Slingerlands, NY (US); Keith E. Fogel, Hopewell Junction, NY (US); Judson R. Holt, Wappingers Falls, NY (US); Balasubramanian Pranatharthiharan, Watervliet, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/906,644

(22) Filed: May 31, 2013

(65) Prior Publication Data

US 2014/0353732 A1    Dec. 4, 2014

(51) Int. Cl.
*H01L 21/425*    (2006.01)
*H01L 29/66*    (2006.01)
*H01L 21/02*    (2006.01)
*H01L 29/78*    (2006.01)

(52) U.S. Cl.
CPC ...... *H01L 29/66492* (2013.01); *H01L 21/0262* (2013.01); *H01L 29/7848* (2013.01)

(58) Field of Classification Search
CPC ............... H01L 21/823412; H01L 21/823807
USPC ............................ 438/142, 197, 510, 514, 527
See application file for complete search history.

(56) References Cited

U.S. PATENT DOCUMENTS

| 7,449,378 | B2 | 11/2008 | Chidambarrao et al. |
| 7,871,876 | B2 | 1/2011 | Anderson et al. |
| 7,915,693 | B2 | 3/2011 | Okano |
| 8,212,336 | B2 | 7/2012 | Goebel et al. |
| 8,278,179 | B2 | 10/2012 | Lin et al. |
| 2008/0093629 | A1* | 4/2008 | Chen et al. .................... 257/190 |
| 2012/0034748 | A1* | 2/2012 | Shin .............................. 438/300 |
| 2012/0135590 | A1* | 5/2012 | Hendrix et al. ............... 438/585 |
| 2012/0153387 | A1 | 6/2012 | Murthy et al. |
| 2012/0280250 | A1 | 11/2012 | Basker et al. |

OTHER PUBLICATIONS

M. Bauer et al., "(Invited) Selective Epitaxial Growth (SEG) of Highly Doped Si: P on Source/Drain Areas of NMOS Devices Using Si3H8/PH3/Cl2 Chemistry," ECS Transactions, vol. 33, No. 6, 2010, pp. 629-636.

K. J. Kuhn, "Considerations for Ultimate CMOS Scaling." IEEE Transactions on Electron Devices, vol. 59, No. 7, 2012, pp. 1813-1828.

K. Cheng et al., "Strain relaxation with self-aligned notch," U.S. Appl. No. 13/687,515, filed Nov. 28, 2012.

* cited by examiner

*Primary Examiner* — Jae Lee
(74) *Attorney, Agent, or Firm* — L. Jeffrey Kelly; Joseph Petronkaitis (57) ABSTRACT

A semiconductor device and method for manufacturing the same, wherein the method includes fabrication of field effect transistors (FET). The method includes growing a doped epitaxial halo region in a plurality of sigma-shaped source and drain recesses within a semiconductor substrate. An epitaxial stressor material is grown within the sigma-shaped source and drain recesses surrounded by the doped epitaxial halo forming source and drain regions with controlled current depletion towards the channel region to improve device performance. Selective growth of epitaxial regions allows for control of dopants profile and hence tailored and enhanced carrier mobility within the device.

20 Claims, 6 Drawing Sheets

HALO REGION FORMATION BY EPITAXIAL GROWTH

FIELD

The present invention relates to semiconductor devices including a doped substrate and a method for manufacturing the same, and more particularly, the present invention relates to semiconductor devices including field effect transistors and halo doped regions, and a method for making the same.

BACKGROUND

In semiconductor manufacturing, complementary metal-oxide-semiconductor (CMOS) technology is commonly used for fabricating field effect transistors (FETs) as part of advanced integrated circuits, such as CPUs, memory, storage devices, and the like. In FETs, a channel region may be formed in an n-doped or p-doped semiconductor substrate on which a gate structure is created. The overall fabrication process may include forming a gate structure over a channel region. The channel region may connect a source region and a drain region within the substrate. The source and drain regions may be on opposite sides of the gate, typically with some vertical overlap between the gate and the source and drain regions.

A desired characteristic in CMOS manufacturing is the presence of a halo region. A halo region may be generally located interposed between the source and drain regions and the channel region, and may be of converse polarity to the source and drain regions. The presence of a halo region may reduce drain-source current leakage (punch-through effect) within the FET.

Halo regions may typically be formed through a low energy, low current ion implantation method carried out at large angle tilt after a gate and gate dielectric are in place. The gate and gate dielectric act as an ion implantation mask allowing implanted dopants to penetrate below the edge of the metal-oxide semiconductor gate stack. This particular method may hinder halo region implantation in faceted recess structures. Furthermore, the low energy, low current ion implantation method described above may compromise performance of FET devices already on the structure, since halo ion implantation may provide undesirable halo residual atoms physically at or near the FET gate dielectric. In addition, as the industry continues to move towards smaller scale devices, halo region implantation becomes even harder due to space reduction between gates (gate shadowing), which may also increase the undesirable effects described above. Additionally, when significant substrate removal occurs during the fabrication of faceted recess structures on a semiconductor substrate, integrity of the implanted halo region may be compromised given that the highest halo concentration is located where the faceted recess is produced.

Therefore, it would be desirable to provide a method and a structure having a field effect transistor on a substrate, and the substrate including a well-defined halo region wherein the halo region formation does not require ion implantation.

SUMMARY

According to at least one exemplary embodiment of the present disclosure, a method of forming a semiconductor device includes: forming a gate on a semiconductor substrate, forming a gate dielectric between the gate and the substrate, forming a source recess and a drain recess in the semiconductor substrate on opposing sides of the gate, epitaxially growing an embedded halo region along a perimeter of each of the source and drain recesses, etching a bottom area along the perimeter of both the source and drain, and epitaxially growing a stressor material to fill the source and drain recesses, wherein the filled source and drain recesses form source and drain regions for conducting current through the channel.

According to another exemplary embodiment of the present disclosure, a semiconductor device comprises: a semiconductor substrate defining multiple recesses in the substrate, a gate located above a semiconductor substrate between the source and drain recesses, a gate dielectric between the semiconductor substrate and the gate, a source recess and a drain recess in the semiconductor substrate on opposing sides of the gate, an epitaxially grown halo region partially along a perimeter of each of the source and drain recesses, an epitaxially grown stressor material inside the source and drain recesses and communicating with a top and bottom region of the recesses, such that the recesses define a source region and a drain region in the semiconductor substrate, and a channel region positioned between the source and drain recesses.

BRIEF DESCRIPTION OF THE DRAWINGS

The features and advantages of the present disclosure will become apparent from the following detailed description of illustrative embodiments thereof, which is to be read in connection with the accompanying drawings. The various features of the drawings are not to scale as the illustrations are for clarity in facilitating one skilled in the art in understanding the disclosure in conjunction with the detailed description. The detailed description should be consulted for accurate dimensions. The drawings are intended to depict only typical embodiments of the invention, and therefore should not be considered as limiting the scope of the invention. In the drawings, like numbering represents like elements. In the drawings.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring to FIGS. 1-10, according to an illustrative embodiment of the present disclosure, a method for manufacturing a semiconductor structure is shown. Specifically, FIGS. 1-10 depict a semiconductor processing technique for providing a semiconductor structure 400 shown in FIG. 4 and an alternate structure 900 shown in FIG. 9.

Figure 1:
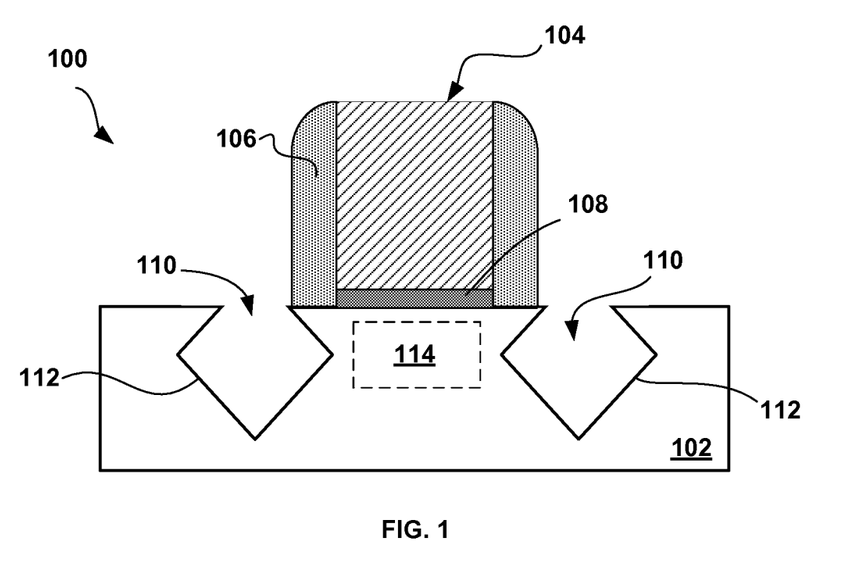
FIG. 1 is a cross sectional side elevational view of a gate layer and sigma-shaped source and drain recesses formed onto a semiconductor substrate, according to one embodiment of the present disclosure.

Referring now to FIG. 1, according to an embodiment of the present disclosure, an initial structure 100 may include a semiconductor substrate embodied as a silicon substrate 102. The semiconductor substrate may be made of any semiconductor material including, but not limited to: silicon, germanium, silicon-germanium alloy, carbon-doped silicon, carbon-doped silicon-germanium alloy, and compound semiconductor materials. FIG. 1 illustrates the formation of a gate structure 104 above a channel region 114 of the semiconductor substrate 102. The gate 104 may include a gate dielectric 108 which may be formed by any method known in the art. The gate dielectric 108 may include a high-k dielectric material having a dielectric constant greater than, for example, 3.9, which is the dielectric constant of silicon oxide. In some embodiments, multiple gates may be formed above the channel region 114 when fabricating multiple transistor structures having shared source and drains. The semiconductor structure 100 may further include a gate spacer 106. The gate spacer 106 may be formed on the sidewalls of the gate 104 by deposition of a dielectric layer. The dielectric layer may be formed by any known technique in the art, for example, by chemical vapor deposition (CVD) of a dielectric material. In another embodiment of the present invention, the gate 104 may be formed in a gate last process where the initial gate structure may comprise a dummy polysilicon gate that may be replaced by a final metal gate structure 104 after device manufacturing is complete.

In the present embodiment, source and drain recesses 110 may be formed adjacent to a channel region 114 in a substrate 102. The recesses may be formed by etching the semiconductor substrate 102 using a dry etching technique. Initial recesses in the semiconductor substrate 102 may have a box shape (not shown), which are then processed to the present sigma shape. Sigma-shaped source and drain recesses 110 as shown in the initial structure 100 may be made utilizing conventional techniques well known to those skilled in the art. For example, anisotropic dry-etching followed by anisotropic wet-etching. The sigma-shaped source and drain recesses 110 may also be referred to as diamond-shaped recesses. Sigma-shaped recesses 110 may be formed to increase strain force on the channel region 114 by narrowing the space between source and drain.

Figure 2:
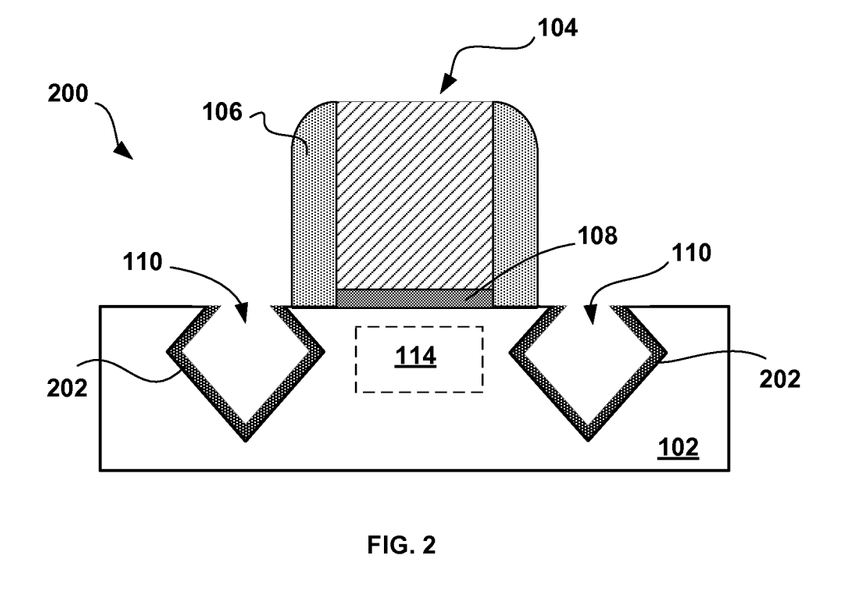
FIG. 2 is a cross sectional side elevational view of an epitaxial halo region formed on a perimeter of the sigma-shaped source and drain recesses shown in FIG. 1, according to one embodiment of the present disclosure.

Referring now to FIG. 2, structure 200 illustrates epitaxial growth of a doped material layer in the device source and drain recesses. The source and drain recesses 110 may include a perimeter 112, as shown in FIG. 1, defining the recesses in the substrate 102. The epitaxial growth may be conducted along the perimeter 112 of each of the source and drain recesses 110 shown in FIG. 1. The epitaxial growth of the doped material layer may form a halo region 202 at each of the source and drain recesses 110, of inverse doping characteristics to the source and drain regions (discussed below), respectively.

The thickness of the epitaxial halo region 202 may vary according to the device structure and the desired device characteristics, including doping of the halo region 202. For example, the thickness of the epitaxial halo region 202 may be in the range of about 2-10 nm. The epitaxial halo region 202 may be formed from a crystalline structure which has the same lattice constant as the underlying semiconductor substrate 102. Dopants may be incorporated into the epitaxial halo region 202 by in-situ doping. For example, for a p-FET structure an n-type halo dopant such as phosphorus or arsenic may be utilized. A phosphorus or arsenic doped silicon (Si:P or Si:As) material or phosphorus or arsenic doped silicon-germanium (SiGe:P or SiGe:As) material may be grown, where the concentration of phosphorus or arsenic may range from $5\times10^{17}$ cm$^{-3}$ to $1\times10^{19}$ cm$^{-3}$. Similarly, for an n-FET structure a p-type dopant such as boron may be incorporated by in-situ doping in the epitaxial halo region. The concentration of boron may range from $5\times10^{17}$ cm$^{-3}$ to $1\times10^{19}$ cm$^{-3}$.

The halo regions 202 provide improved channel region 114 isolation within the FET device 200. Halo regions are areas of opposite higher dopant concentration in close proximity to the device gate. Usually halo regions are located underneath the device gate 104 and the inversion channel 114. Halo regions are commonly used to avoid punch-through effect in short-channel devices.

A tilted ion implantation method is typically used to introduce the required dopant species into the substrate 102. Because of the continuous reduction of transistor dimensions, high-angle ion implantation method may result in undesirable residual halo implantation ions at or near the gate hence compromising FET performance. In contrast, in-situ doped halo regions formed by a selective epitaxial growth process may provide well-defined halo regions with the desired dopant profile without affecting FET performance especially for 22 nm technologies and beyond.

Figure 3:
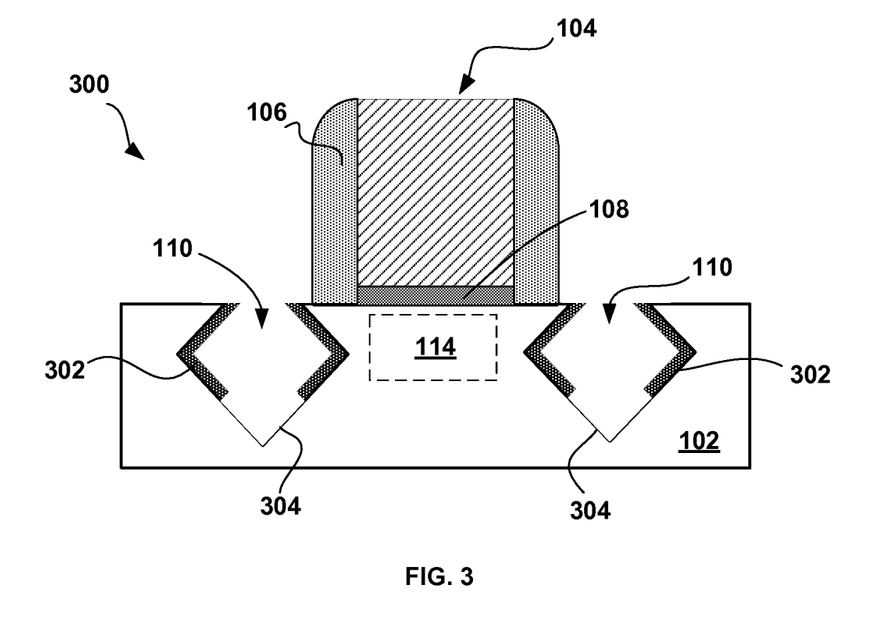
FIG. 3 is a cross sectional side elevational view depicting a bottom part of the sigma-shaped source and drain recesses being etched to remove part of the halo region shown in FIG. 2, according to one embodiment of the present disclosure.

Referring to FIG. 3, a bottom portion of the halo region 202 shown in FIG. 2 may be removed, for example, by a directional reactive-ion etching technique (RIE). The removal of this portion of the halo region may be performed to provide a butting contact area 304 within the device 300. The technique then includes filling the sigma-shaped recesses 110 with a stressor material, such as embedded silicon germanium (eSiGe) for p-FET devices or carbon-doped silicon (Si:C) for n-FET devices. The stressor material may apply a stress onto the channel region 114, thus improving device performance.

Figure 4:
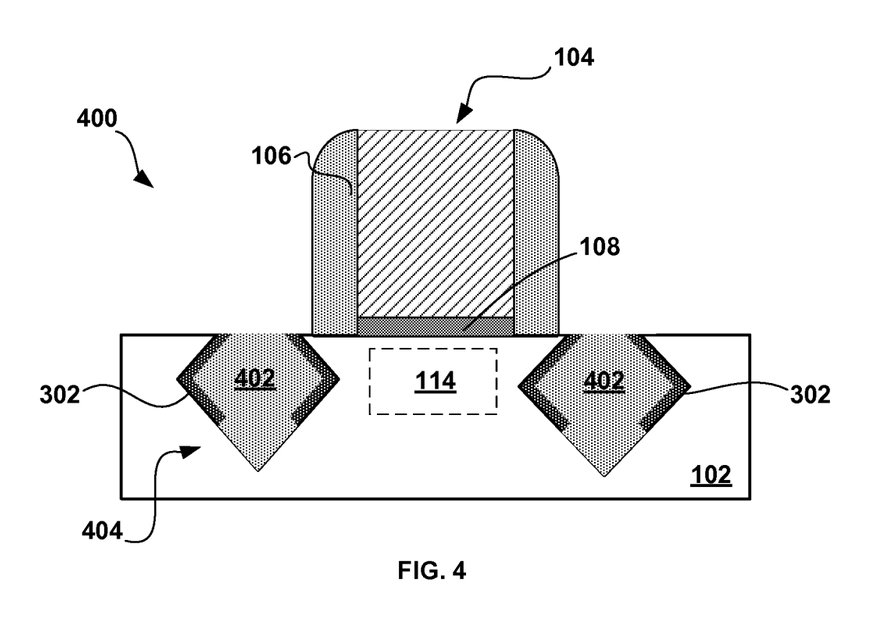
FIG. 4 is a cross sectional side elevational view depicting an epitaxial embedded stressor material region formed between the halo regions to fill the sigma-shaped source and drain recesses shown in FIG. 3, according to one embodiment of the present disclosure.

Referring to FIG. 4, according to one embodiment of the present disclosure, a stressor material 402 may be grown epitaxially within the source and drain recesses 110 shown in FIG. 3 to form the source and drain regions 404 of the semiconductor device 400. The stressor material usually has a larger lattice constant for p-FET devices or a smaller lattice constant for n-FET devices than that of the semiconductor substrate 102 in order to apply a compressive or a tensile strain into the channel region 114 respectively. Lattice stress may be transferred from the source and drain regions 404 to the underlying semiconductor substrate 102.

Source and drain regions 404 include the stressor material 402 and the halo regions 302. The halo regions 302 can be considered adjacent to the stressor material 402 and part of the source and drain regions 404.

For example, for a p-FET device, the epitaxially grown stressor material may include a silicon-germanium (SiGe) material, where the atomic concentration of germanium (Ge) may range from about 10-80%. In an embodiment of the present disclosure, the concentration of germanium (Ge) may be 25-50%. The epitaxially grown stressor material may provide a compressive strain to the channel region 114. More specifically, the stressor material region may induce a compressive stress in the p-FET channel region 114 which enhances carrier mobility and increases drive current. Thus, the source and drain regions 404 may include enhanced carrier mobility provided by the epitaxial stressor material and effective current isolation provided by the epitaxial halo region 302. Dopants such as boron may be incorporated into the silicon-germanium epitaxial region by in-situ doping. The percentage of boron may range from $1\times10^{19}$ cm$^{-3}$ to $2\times10^{21}$ cm$^{-3}$, preferably $1\times10^{20}$ cm$^{-3}$ to $1\times10^{21}$ cm$^{-3}$.

For example, for an n-FET device, the epitaxially grown stressor material may include a carbon-doped silicon (Si:C) material, where the atomic concentration of carbon (C) may range from about 0.4-3.0%. The epitaxially grown stressor material may provide a tensile strain to the channel region 114. More specifically, the stressor material region may induce a tensile stress in the n-FET channel region 114 which enhances carrier mobility and increases drive current. Thus, the source and drain regions 404 may include enhanced carrier mobility provided by the epitaxial stressor material region and effective current isolation provided by the epitaxial halo region 302. Dopants such as phosphorus or arsenic may be incorporated into the carbon-doped epitaxial region by in-situ doping. The percentage of phosphorus or arsenic may range from $1\times10^{19}$ cm$^{-3}$ to $2\times10^{21}$ cm$^{-3}$, preferably $1\times10^{20}$ cm$^{-3}$ to $1\times10^{21}$ cm$^{-3}$.

Figure 5:
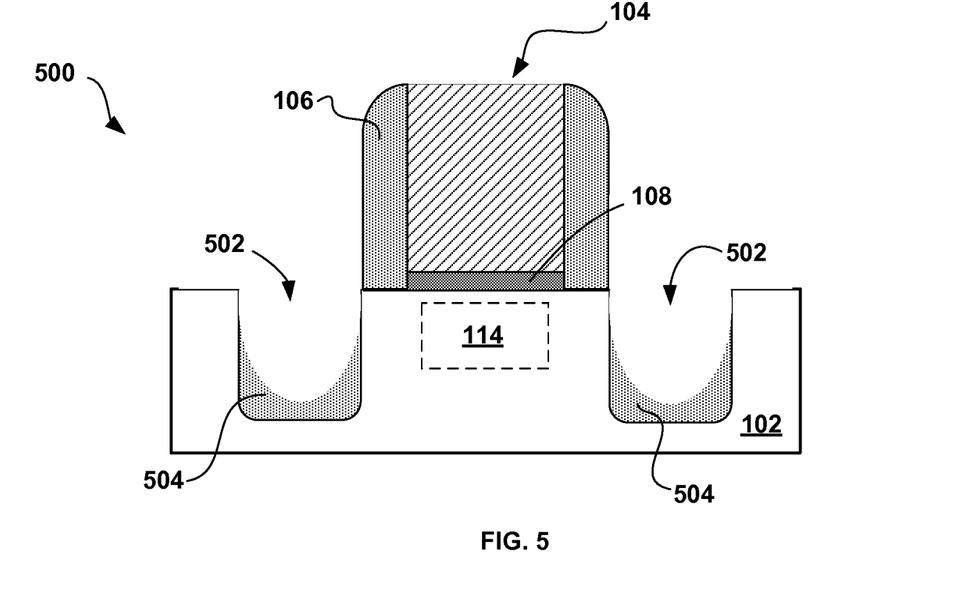
FIG. 5 is a cross sectional side elevational view depicting an initial step in the formation of an optional first epitaxial halo region located below the channel region in each of the source and drain recesses, according to one embodiment of the present disclosure.

Referring to FIG. 5, in another embodiment of the present invention, an initial structure 500 depicts the formation of a doped material layer region in the lower part of preliminary box-shaped source and drain recesses 103. The process may include epitaxially growing a doped sacrificial layer 504 in the box-shaped source and drain recesses 502. The sacrificial layer 504 may comprise the epitaxial growth of silicon-germanium (SiGe) or carbon-doped silicon (Si:C) with the corresponding dopants, according to p-FET or n-FET structures. Following the formation of the sacrificial layer 504, an in-situ etching process may be conducted to form sigma-shaped source and drain recesses.

Figure 6:
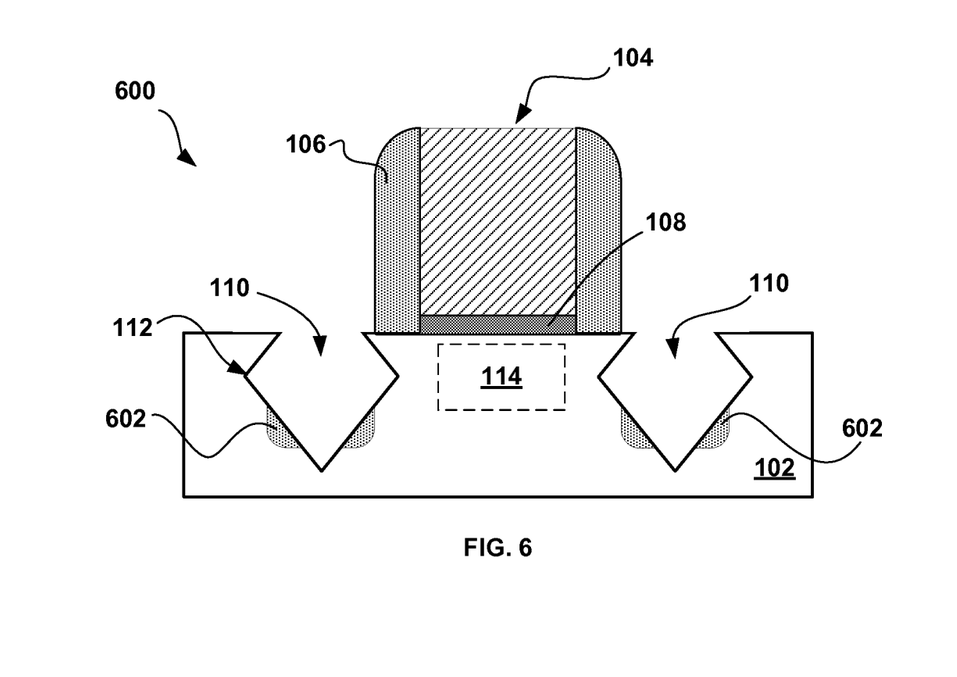
FIG. 6 is a cross sectional side elevational view depicting the formation of sigma-shaped source and drain recesses including an optional first epitaxial halo region below the channel region, according to one embodiment of the present disclosure.

Referring now to FIG. 6, sigma-shaped recesses 110 may be formed by etching the semiconductor substrate 102 using any suitable etching technique, for example the substrate 102 may be etched using an in-situ gas-phase hydrochloric acid (HCl) etching procedure. A bottom halo region embodied as an optional first halo region 602 may be epitaxially grown in the recesses before forming the sigma-shaped recesses 110, as described in FIG. 5. This optional doped region 602 may form a first halo region located below the channel region 114 that can be extended forming a second halo region 202 (as shown in FIG. 2) following the procedure previously described in FIGS. 1-4. In short channel devices, there is a possibility for space charge regions (SCR), associated with source and drain regions, to come into close contact with each other which in turn increases punch-through effect. The presence of a halo region near the source and drain regions and beneath the inversion channel suppresses the width of the space charge regions, hence reducing punch-through effect.

The thickness of the epitaxially grown first halo region 602 may vary according to the device structure and the device desired characteristics including doping of the first halo region 602. For example, the thickness of the first epitaxial halo region 602 may be in the range of about 2-10 nm. Dopants may be incorporated into the optional halo region 602 by in-situ doping. For example, for a p-FET structure an n-type halo dopant such as phosphorus or arsenic may be utilized. A phosphorus or arsenic doped silicon (Si:P or Si:As) material or phosphorus or arsenic doped silicon-germanium (SiGe:P or SiGe:As) material may be grown, where the concentration of phosphorus or arsenic may range from $5\times10^{17}$ cm$^{-3}$ to $1\times10^{19}$ cm$^{-3}$. Similarly, for an n-FET structure a p-type dopant such as boron may be incorporated by in-situ doping in the epitaxial halo region. The concentration of boron may range from $5\times10^{17}$ cm$^{-3}$ to $1\times10^{19}$ cm$^{-3}$.

Figure 7:
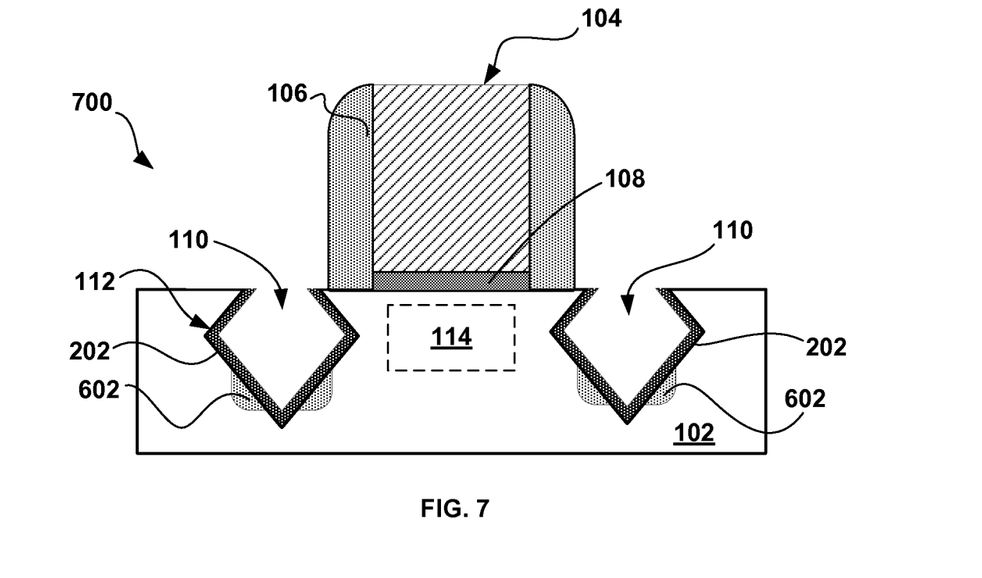
FIG. 7 is a cross sectional side elevational view depicting a second epitaxial halo region formed adjacent to the optional first epitaxial halo region. The second epitaxial halo region located in a top portion of the perimeter of the sigma-shaped source and drain recesses, according to one embodiment of the present disclosure.

Referring now to FIG. 7, subsequent to the formation of the first epitaxial halo region 602, a second doped region 202 may be epitaxially grown on a perimeter 112 of the source and drain recesses 110. The formation of a second epitaxial halo region 202 follows the technique regarding in FIG. 2. Dopants may be incorporated into the second epitaxial halo region 202 by in-situ doping. For example, for a p-FET structure an n-type halo dopant such as phosphorus or arsenic may be utilized. A phosphorus or arsenic doped silicon (Si:P or Si:As) material or phosphorus or arsenic doped silicon-germanium (SiGe:P or SiGe:As) material may be grown, where the concentration of phosphorus or arsenic may range from $5\times10^{17}$ cm$^{-3}$ to $1\times10^{19}$ cm$^{-3}$. Similarly, for an n-FET structure a p-type dopant such as boron may be incorporated by in-situ doping in the epitaxial halo region. The concentration of boron may range from $5\times10^{17}$ cm$^{-3}$ to $1\times10^{19}$ cm$^{-3}$.

Figure 8:
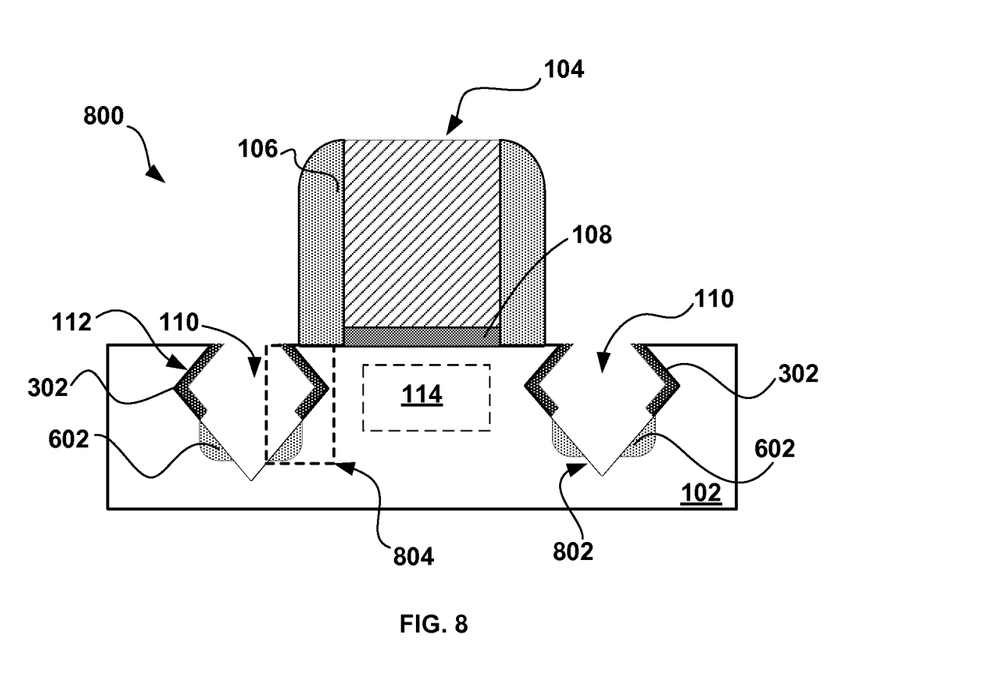
FIG. 8 is a cross sectional side elevational view depicting a bottom part of the sigma-shaped source and drain recesses being etched to remove part of the second halo region shown in FIG. 7, according to one embodiment of the present disclosure.

Referring to FIG. 8, the bottom part of the second halo region 202 shown in FIG. 7 may be removed, for example, by a directional reactive-ion etching technique (RIE). The removal of this portion of the second halo region may be performed to provide a butting contact area 802 within the device 800. The technique then may include filling the sigma-shaped recesses 110 with a stressor material, such as embedded silicon germanium (eSiGe) for p-FET devices and carbon-doped silicon (Si:C) for n-FET devices. The stressor material may apply a stress onto the channel region 114, thus improving device performance.

The first epitaxial halo region 602 and the second epitaxial halo region 302 may form an extended halo region 804 along the perimeter 112 of the source and drain recesses 110. The extended halo region 804 may further improve carrier mobility within the FET device.

Figure 9:
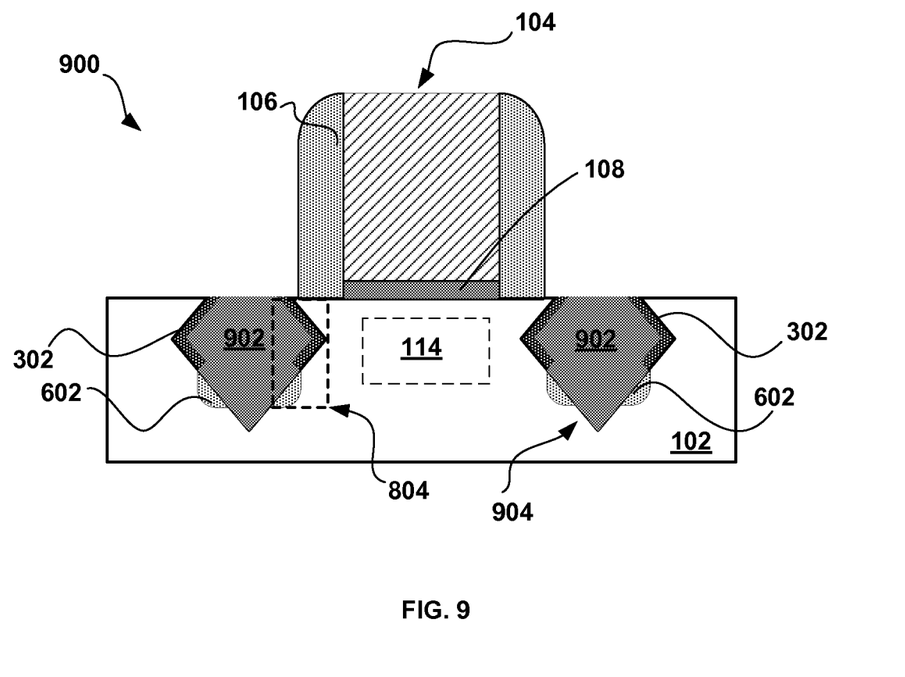
FIG. 9 is a cross sectional side elevational view depicting an epitaxial stressor material region formed in the sigma-shaped source and drain recesses shown in FIG. 8, according to one embodiment of the present disclosure.

Referring now to FIG. 9, a stressor material region 902 may be formed to fill the source and drain recesses 110 shown in FIG. 8, in order to increase the strain force applied to the channel region 114. The stressor material region 902 may be similar to, and formed similarly to, the stressor material region 402 of FIG. 4. The epitaxial stressor material region 902 and the extended epitaxial halo region 804 may form the device source and drain regions 904.

For example, for a p-FET device, an epitaxially grown stressor material 902 may include a silicon-germanium (SiGe) material, where the atomic concentration of germanium (Ge) may range from about 10-80%. In an embodiment of the present disclosure, the concentration of germanium (Ge) may be 25-50%. The epitaxially grown stressor material 902 embodied as an embedded silicon-germanium region in structure 900, may provide a compressive strain to the channel region 114. More specifically, the stressor material region 902 may induce a compressive stress in the p-FET channel region 114 which enhances carrier mobility and increases drive current. Thus, the source and drain regions 904 may include enhanced carrier mobility provided by the epitaxial stressor material region 902 and effective current isolation provided by the extended epitaxial halo region 804. Dopants such as boron may be incorporated into the silicon-germanium epitaxial region by in-situ doping. The percentage of boron may range from $1\times10^{19}$ cm$^{-3}$ to $2\times10^{21}$ cm$^{-3}$, preferably $1\times10^{20}$ cm$^{-3}$ to $1\times10^{21}$ cm$^{-3}$.

For example, for an n-FET device, an epitaxially grown stressor material 902 may include a carbon-doped silicon (Si:C) material, where the atomic concentration of carbon (C) may range from about 0.4-3.0%. The epitaxially grown stressor material 902 embodied as an embedded carbon-doped silicon region in structure 900, may provide a tensile strain to the channel region 114. More specifically, the stressor material region 902 may induce a tensile stress in the n-FET channel region 114 which enhances carrier mobility and increases drive current. Thus, the source and drain regions 904 may include enhanced carrier mobility provided by the epitaxial stressor material region 902 and effective current isolation provided by the extended epitaxial halo region 804. Dopants such as phosphorus or arsenic may be incorporated into the carbon-doped epitaxial region by in-situ doping. The percentage of phosphorus or arsenic may range from $1\times10^{19}$ cm$^{-3}$ to $2\times10^{21}$ cm$^{-3}$, preferably $1\times10^{20}$ cm$^{-3}$ to $1\times10^{21}$ cm$^{-3}$.

Figure 10:
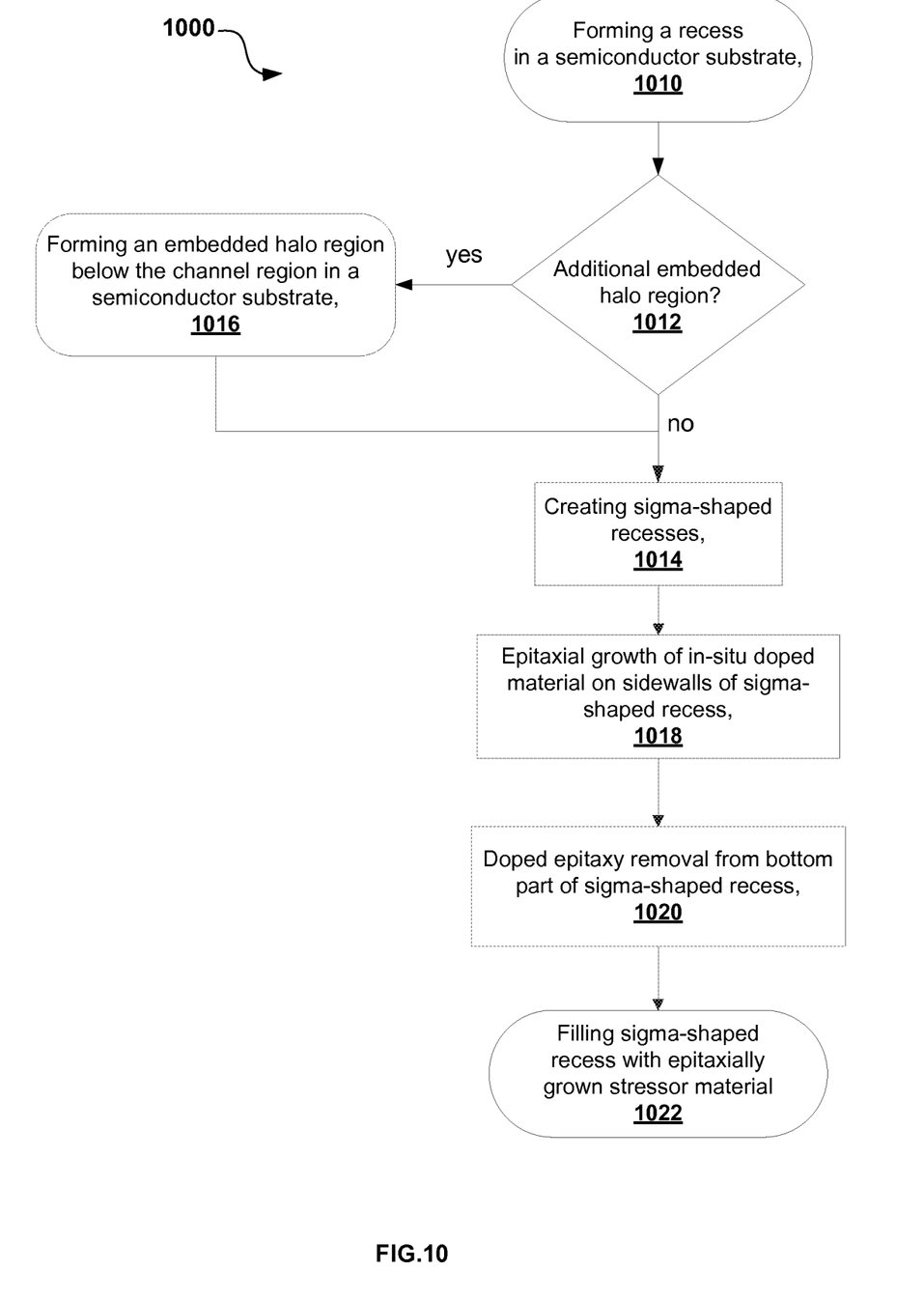
FIG. 10 is a flow chart showing a method for the fabrication of source and drain regions containing an epitaxial halo within a semiconductor substrate, according to one embodiment of the present disclosure.

Referring now to FIG. 10, a flowchart depicting the formation of source and drain regions within a semiconductor substrate is shown. The main process consists of several consecutive steps (1010, 1012, 1014, 1018, 1020 and 1022) to achieve sigma-shaped source and drain with a well-defined halo region. The method described in FIG. 10 includes an optional process 1016 that may comprise the formation of a first halo region in the bottom part of the source and drain recesses below the device channel region. Such optional halo region may be epitaxially grown before etching the semiconductor substrate to form sigma-shaped recesses. Once the optional first halo region 1016 is formed, a second halo region may be grown following steps 1018 and 1020. Subsequently, an epitaxial stressor material 1022 may be grown within the source and drain recesses to ultimately obtained sigma-shaped source and drain with a well-defined extended halo region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

We claim:

1. A method of forming a semiconductor device comprising the steps of:
    forming a source recess and a drain recess in a semiconductor substrate on opposing sides of a gate positioned above the semiconductor substrate;
    forming an epitaxial halo region at the bottom of the source and drain recesses lower than a channel region, wherein the epitaxial halo region comprises growing a sacrificial layer including a silicon-germanium or carbon-doped silicon material with the corresponding p-type or n-type dopant;
    etching the source and drain recesses in the semiconductor substrate to form sigma-shaped source and drain recesses, wherein a portion of the epitaxial halo region remains on opposing lower sides of the sigma-shaped source and drain recesses;
    epitaxially growing an embedded halo region along a perimeter of each of the sigma-shaped source and drain recesses;
    removing a bottom area of the embedded halo region along the perimeter of both the sigma-shaped source and drain recesses; and
    epitaxially growing a stressor material to fill the sigma-shaped source and drain recesses, wherein the filled sigma-shaped source and drain recesses form source and drain regions for conducting current through the channel.

2. The method of claim 1, wherein epitaxially growing the stressor material comprises the step of epitaxially growing a silicon-germanium or carbon-doped silicon material including a p-type or n-type dopant.

3. The method of claim 1, wherein the epitaxial halo region and the embedded halo region are grown with in-situ dopants, including boron, phosphorous, or arsenic.

4. The method of claim 1, wherein the bottom area of the embedded halo region is removed by a reactive-ion etching technique to create a butting contact area.

5. The method of claim 1, wherein the stressor material comprises opposite doping polarity relative to the epitaxial halo region and the embedded halo region.

6. The method of claim 1, wherein the embedded halo region comprises a similar lattice constant as the semiconductor substrate.

7. The method of claim 1, wherein the stressor material comprises a different lattice constant as the semiconductor substrate.

8. The method of claim 1, wherein the epitaxial halo region is grown before the step of forming the sigma-shaped source and drain recesses.

9. The method of claim 1, wherein the step of forming the gate includes:
    forming a dummy poly gate; and
    replacing the dummy poly gate with a metal high-k dielectric gate structure.

10. The method of claim 9, wherein the step of forming a dummy poly gate occurs before the step of forming source and drain recesses, and the step of replacing the dummy poly gate occurs after the step of epitaxially growing the stressor material.

11. A method of forming a semiconductor device comprising the steps of:
    forming a source recess and a drain recess in a semiconductor substrate on opposing sides of a gate positioned above the semiconductor substrate;
    forming an epitaxial halo region at the bottom of the source and drain recesses lower than a channel region;

etching the source and drain recesses in the semiconductor substrate to form sigma-shaped source and drain recesses, a portion of the epitaxial halo region remains on opposing lower sides of the sigma-shaped source and drain recesses, wherein the epitaxial halo region is grown before the step of forming the sigma-shaped source and drain recesses;

epitaxially growing an embedded halo region along a perimeter of each of the sigma-shaped source and drain recesses;

removing a bottom area of the embedded halo region along the perimeter of both the sigma-shaped source and drain recesses; and epitaxially growing a stressor material to fill the sigma-shaped source and drain recesses, wherein the filled sigma-shaped source and drain recesses form source and drain regions for conducting current through the channel.

12. The method of claim 11, wherein epitaxially growing the stressor material comprises the step of epitaxially growing a silicon-germanium or carbon-doped silicon material including a p-type or n-type dopant.

13. The method of claim 11, wherein the bottom area of the embedded halo region is removed by a reactive-ion etching technique to create a butting contact area.

14. The method of claim 11, wherein the stressor material comprises opposite doping polarity relative to the epitaxial halo region and the embedded halo region.

15. The method of claim 11, wherein the embedded halo region comprises a similar lattice constant as the semiconductor substrate.

16. The method of claim 11, wherein the stressor material comprises a different lattice constant as the semiconductor substrate.

17. A method of forming a semiconductor device comprising the steps of:

forming a dummy poly gate;

forming a source recess and a drain recess in a semiconductor substrate on opposing sides of the dummy poly gate positioned above the semiconductor substrate;

epitaxially growing an embedded halo region along a perimeter of each of the source and drain recesses;

removing a bottom area of the embedded halo region along the perimeter of both the source and drain recesses; and epitaxially growing a stressor material to fill the source and drain recesses, wherein the filled source and drain recesses form source and drain regions for conducting current through a channel; and replacing the dummy poly gate with a metal high-k dielectric gate structure, wherein the step of forming a dummy poly gate occurs before the step of forming source and drain recesses, and the step of replacing the dummy poly gate occurs after the step of epitaxially growing the stressor material.

18. The method of claim 17, wherein the source and drain recesses are sigma-shaped.

19. The method of claim 17 further comprising forming an epitaxial halo region at the bottom of the source and drain recesses lower than the channel region.

20. The method of claim 19, wherein the epitaxial halo region comprises growing a sacrificial layer including a silicon-germanium or carbon-doped silicon material with the corresponding p-type or n-type dopant.

* * * * *